(12) United States Patent
Lee et al.

(10) Patent No.: US 12,191,157 B2
(45) Date of Patent: Jan. 7, 2025

(54) MANUFACTURING METHOD OF SEMICONDUCTOR MEMORY DEVICE

(71) Applicant: SK hynix Inc., Icheon-si (KR)

(72) Inventors: Seung Cheol Lee, Icheon-si (KR); Dae Min Kim, Icheon-si (KR); Dae Sung Kim, Icheon-si (KR); Sang Seob Lee, Icheon-si (KR); Hyun Woo Jin, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 496 days.

(21) Appl. No.: 17/685,611

(22) Filed: Mar. 3, 2022

(65) Prior Publication Data

US 2023/0129758 A1    Apr. 27, 2023

(30) Foreign Application Priority Data

Oct. 26, 2021   (KR) .......................... 10-2021-0143991

(51) Int. Cl.
| | |
|---|---|
| *H01L 21/311* | (2006.01) |
| *H10B 41/27* | (2023.01) |
| *H10B 43/27* | (2023.01) |
| *H10B 41/35* | (2023.01) |
| *H10B 41/41* | (2023.01) |
| *H10B 43/35* | (2023.01) |
| *H10B 43/40* | (2023.01) |

(52) U.S. Cl.
CPC ........ *H01L 21/31116* (2013.01); *H10B 41/27* (2023.02); *H10B 43/27* (2023.02); *H10B 41/35* (2023.02); *H10B 41/41* (2023.02); *H10B 43/35* (2023.02); *H10B 43/40* (2023.02)

(58) Field of Classification Search
None
See application file for complete search history.

(56) References Cited

U.S. PATENT DOCUMENTS

2021/0104539 A1* 4/2021 Lee ................. H10B 41/27
2021/0175169 A1* 6/2021 Li .................. H01L 21/76897

FOREIGN PATENT DOCUMENTS

| KR | 1020100065875 A | 6/2010 |
|---|---|---|
| KR | 101933116 B1 | 12/2018 |

* cited by examiner

*Primary Examiner* — Roberts P Culbert
(74) *Attorney, Agent, or Firm* — WILLIAM PARK & ASSOCIATES LTD.

(57) ABSTRACT

A method of manufacturing a semiconductor memory device includes alternately stacking sacrificial layers and interlayer insulating layers over a lower structure, forming a slit passing through the sacrificial layers and the interlayer insulating layers, removing the sacrificial layers through the slit through a wet etching process, and removing, through a dry etching process, a byproduct that is produced at ends of the interlayer insulating layers during the wet etching process.

11 Claims, 13 Drawing Sheets

MANUFACTURING METHOD OF SEMICONDUCTOR MEMORY DEVICE

CROSS-REFERENCE TO RELATED APPLICATION

The present application claims priority under 35 U.S.C. § 119(a) to Korean patent application number 10-2021-0143991, filed on Oct. 26, 2021, in the Korean Intellectual Property Office, the entire disclosure of which is incorporated herein by reference.

BACKGROUND

1. Technical Field

Various embodiments of the present disclosure generally relate to a method of manufacturing a semiconductor memory device, and more particularly, to a method of manufacturing a three-dimensional semiconductor memory device.

2. Related Art

A semiconductor memory device may include a memory cell array including a plurality of memory cells. The memory cell array may include memory cells arranged in various structures. The memory cells may be three-dimensionally arranged on a substrate to improve integration density of the semiconductor memory device. A stacked structure with a plurality of material layers stacked therein may be used in manufacturing a three-dimensional semiconductor memory device.

SUMMARY

According to an embodiment, a method of manufacturing a semiconductor memory device may include alternately stacking sacrificial layers and interlayer insulating layers over a lower structure, forming a slit passing through the sacrificial layers and the interlayer insulating layers, removing the sacrificial layer through the slit through a wet etching process, and removing, through a dry etching process, a byproduct that is produced at ends of the interlayer insulating layers during the wet etching process.

DETAILED DESCRIPTION

Specific structural or functional descriptions disclosed herein are merely illustrative for the purpose of describing embodiments according to the concept of the present disclosure. Embodiments according to the concept of the present disclosure should not be construed as being limited to the specific embodiments set forth herein, but may be implemented in various forms.

In embodiments of the present disclosure, the terms such as "first" and "second" may be used to describe various components. However, the components should not be limited by these terms. The above terms are used to distinguish one component from another component. For example, a first component may be referred to as a second component without departing from the scope in accordance with the concept of the present disclosure and similarly, a second component may be referred to as a first component.

Embodiments of the present disclosure may be implemented in a three-dimensional NAND structure, a three-dimensional DRAM structure, or the like.

Various embodiments may provide a method of manufacturing a semiconductor memory device capable of improving operational reliability.

Figure 1A:
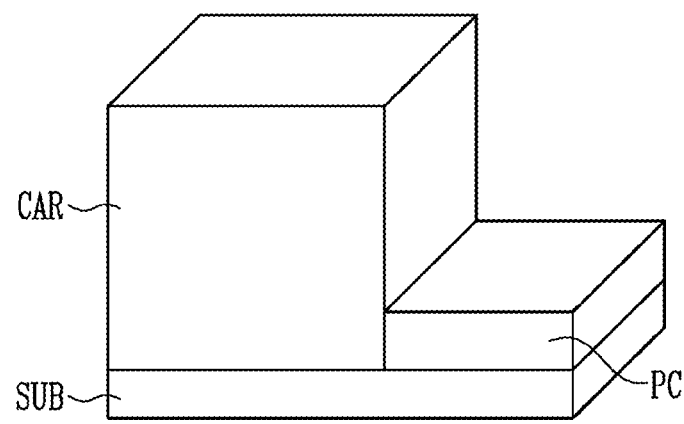
FIGS. 1A and 1B are schematic block diagrams illustrating semiconductor memory devices according to embodiments.
Figure 1B:
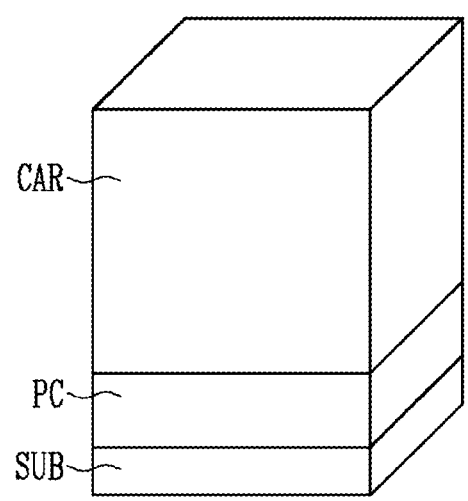

FIGS. 1A and 1B are schematic block diagrams illustrating semiconductor memory devices according to embodiments.

Referring to FIGS. 1A and 1B, each of the semiconductor memory devices according to embodiments may include a peripheral circuit structure PC and a cell array CAR that are disposed on a substrate SUB.

The substrate SUB may be a single crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film that is formed through a selective epitaxial growth method.

The cell array CAR may include a plurality of memory blocks. Each of the memory blocks may include a plurality of cell strings. Each of the cell strings may be electrically coupled to a bit line, a source line, word lines, and select lines. Each of the cell strings may include memory cells and select transistors that are coupled in series to each other. Each of the select lines may serve as a gate electrode for each of the corresponding select transistors. Each of the word lines may serve as a gate electrode for each of the corresponding memory cells.

The peripheral circuit structure PC may include NMOS transistors, PMOS transistors, a resistor, and a capacitor that are electrically coupled to the cell array CAR. The NMOS and PMOS transistors, the resistor, and the capacitor may serve as elements that form a row decoder, a column decoder, a page buffer, and a control circuit.

As shown in FIG. 1A, the peripheral circuit structure PC may be disposed in a region of the substrate SUB that does not overlap the cell array CAR.

Alternatively, as shown in FIG. 1B, the peripheral circuit structure PC may be disposed between the cell array CAR and the substrate SUB. Since the peripheral circuit structure PC overlaps the cell array CAR, an area of the substrate SUB that is occupied by the cell array CAR and the peripheral circuit structure PC may be reduced.

Figure 2A:
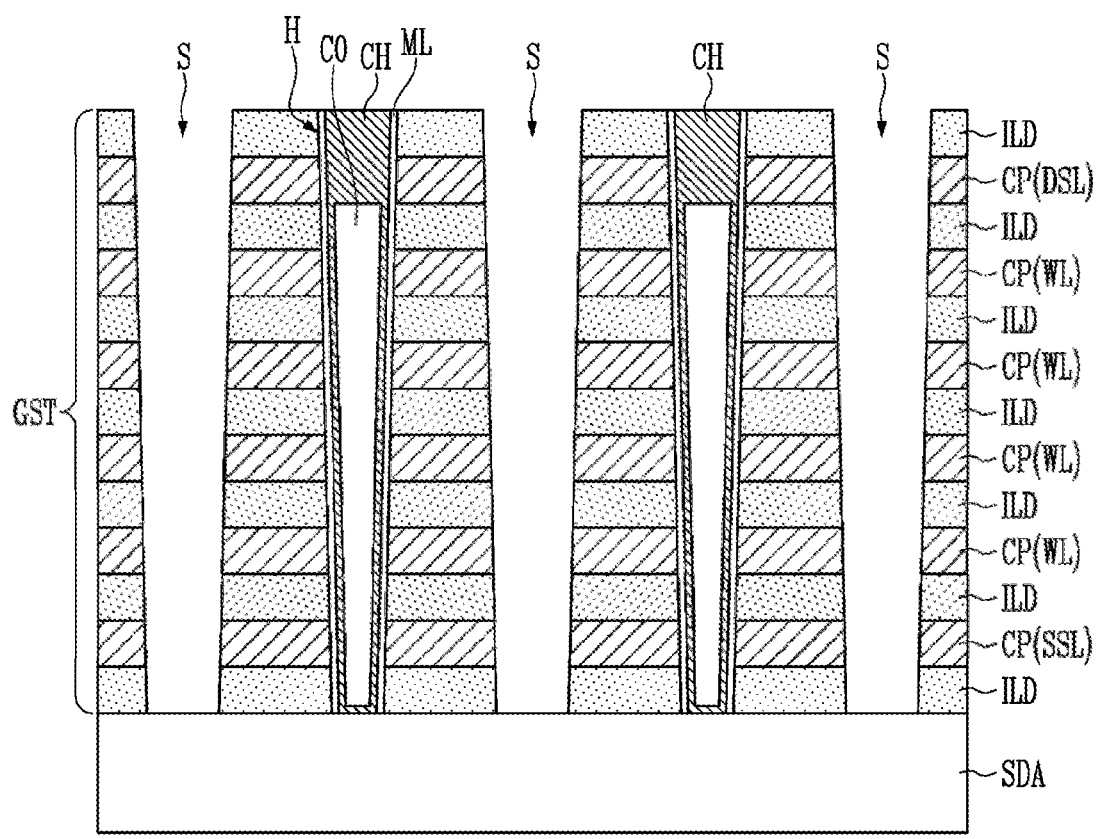
FIGS. 2A, 2B, and 2C are cross-sectional diagrams illustrating a semiconductor memory device according to various embodiments.
Figure 2B:
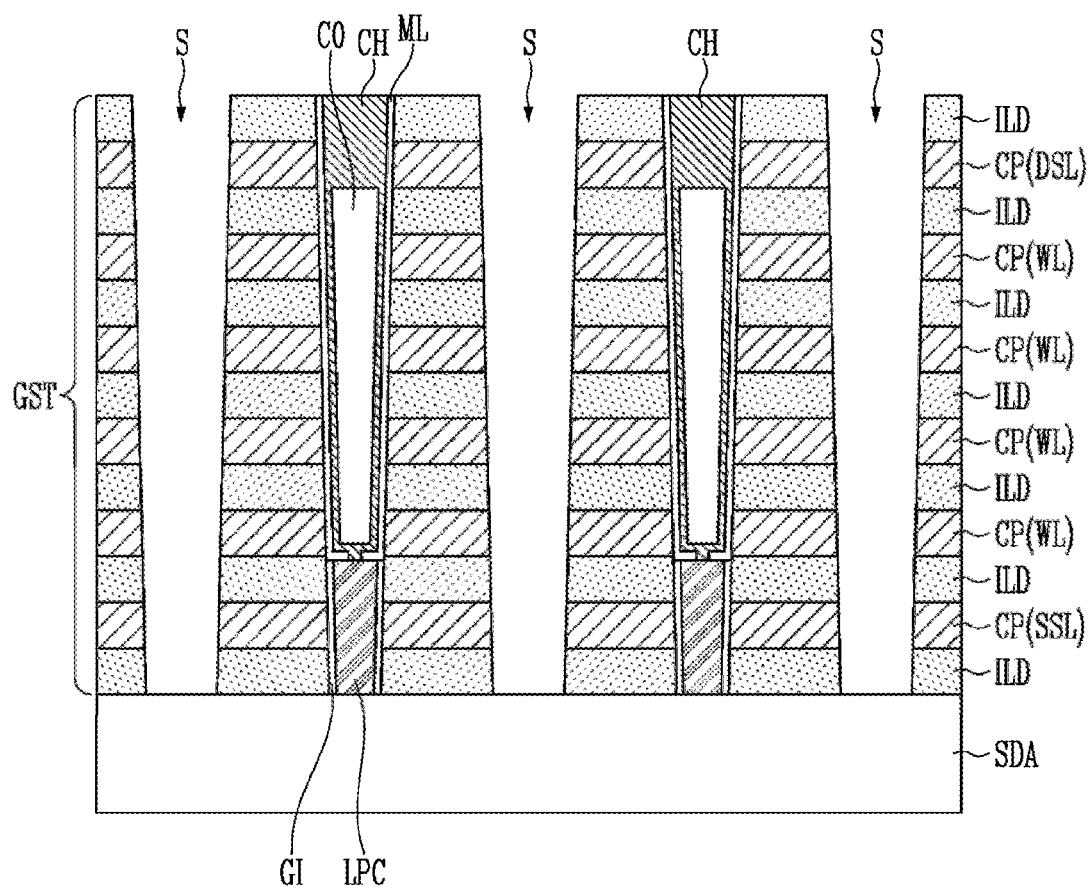
Figure 2C:
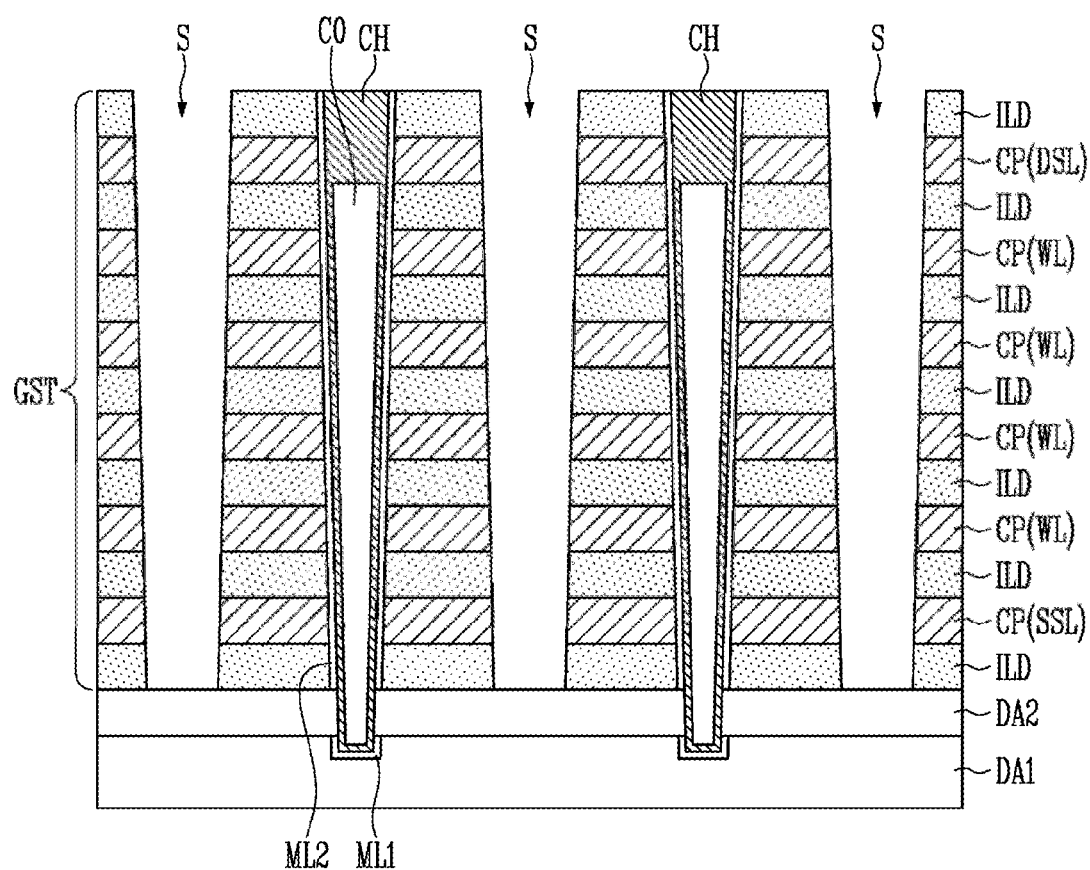

FIGS. 2A, 2B, and 2C are cross-sectional diagrams illustrating a semiconductor memory device according to various embodiments.

Referring to FIGS. 2A, 2B, and 2C, the semiconductor memory device according to an embodiment may include a gate stacked structure GST. The gate stacked structure GST may include interlayer insulating layers ILD and conductive patterns CP that are alternately stacked on each other in a vertical direction over the substrate SUB, shown in FIG. 1A or FIG. 1B. More specifically, the conductive patterns CP of the gate stacked structure GST may include word lines WL that are stacked to be spaced apart from each other, at least one drain select line DSL that is disposed over the word lines WL, and at least one source select line SSL that is disposed below the word lines WL.

Slits S may be disposed in the gate stacked structure GST. The slits S may divide the gate stacked structure GST to define boundaries of the gate stacked structure GST. The slits S may extend in the vertical direction to define sidewalls of the gate stacked structure GST. Although not illustrated in FIGS. 2A, 2B, and 2C, each of the slits S may be filled with a vertical structure. The vertical structure may include only an insulating material. Alternatively, the vertical structure may include a vertical conductive pattern and an insulating layer that extends along a sidewall of the vertical conductive pattern.

Each of the conductive patterns CP and the interlayer insulating layers ILD may surround channel structures CH. Each of the channel structures CH may include a semiconductor material, such as silicon. Each of the channel structures CH may include a liner pattern that surrounds a sidewall of a core insulating layer CO and a capping pattern that is disposed on the core insulating layer CO. The capping pattern of each of the channel structures CH may include a conductivity-type impurity. According to an embodiment, the conductivity-type impurity may include an n-type impurity. A memory layer ML may be disposed between each of the channel structures CH and the gate stacked structure GST. The memory layer ML may extend along a sidewall of each of the corresponding channel structures CH. However, embodiments are not limited thereto. Although not illustrated in FIGS. 2A, 2B, and 2C, according to an embodiment, the memory layer ML may be disposed on a sidewall of each of the conductive patterns CP that faces the channel structures CH and may extend along interfaces between each of the conductive patterns CP and the interlayer insulating layers ILD that are adjacent to each of the conductive patterns CP. According to the above-described embodiment, the memory layer ML may have a cross-sectional structure with a C shape that is opened to the slit S.

Referring to FIG. 2A, the channel structures CH may pass through the gate stacked structure GST. According to an embodiment shown in FIG. 2A, each of the channel structures CH may include a bottom surface that directly contacts a source doped semiconductor layer SDA that is disposed below the gate stacked structure GST.

Referring to FIG. 2B, each of the channel structures CH may be coupled to the source doped semiconductor layer SDA that is disposed below the gate stacked structure GST via a lower channel LPC that is disposed below each of the channel structures CH. According to an embodiment shown in FIG. 2B, each of the channel structures CH may be formed to pass through the drain select line DSL, and the word lines WL of the gate stacked structure GST and the lower channel LPC may be formed to pass through the source select line SSL. The lower channel LPC may be formed through a growth method, such as an epitaxial growth method that uses the source doped semiconductor layer SDA as a seed layer or through a deposition method of a semiconductor layer. The lower channel LPC may serve as a channel of a source select transistor, and a sidewall of the lower channel LPC may be surrounded by a gate insulating layer GI. The lower channel LPC may include a doped semiconductor layer. According to an embodiment, the lower channel LPC may include an n-type doped silicon layer.

The source doped semiconductor layer SDA, shown in FIGS. 2A and 2B, may include a conductivity-type dopant for a source junction and may serve as a common source line. The source doped semiconductor layer SDA may include at least one of an n-type impurity and a p-type impurity. According to an embodiment, the source doped semiconductor layer SDA may include an n-type doped silicon layer. A sidewall of each of the channel structures CH, shown in FIGS. 2A and 2B, may be surrounded by the memory layer ML.

Referring to FIG. 2C, the channel structures CH may extend into first and second doped semiconductor layers DA1 and DA2 that are disposed below the gate stacked structure GST. The second doped semiconductor layer DA2 may be disposed between the first doped semiconductor layer DA1 and the gate stacked structure GST. The first and second doped semiconductor layers DA1 and DA2 may be doped with a source dopant or a well dopant. According to an embodiment, each of the first and second doped semiconductor layers DA1 and DA2 may be doped with an n-type dopant. According to another embodiment, each of the first and second doped semiconductor layers DA1 and DA2 may be doped with a p-type dopant. According to another embodiment, the first doped semiconductor layer DA1 and the second doped semiconductor layer DA2 may each be doped with a different type of conductivity-type dopant. For example, the first doped semiconductor layer DA1 may be doped with a p-type dopant, and the second doped semiconductor layer DA2 may be doped with an n-type dopant. Each of the channel structures CH may have a sidewall that directly contacts the second doped semiconductor layer DA2. The second doped semiconductor layer DA2 may pass through a side portion of a memory layer that extends along an outer wall of each of the channel structures CH. Accordingly, the memory layer may be divided into a first memory pattern ML1 and a second memory pattern ML2 by the second doped semiconductor layer DA2. The first memory pattern ML1 may be disposed between the first doped semiconductor layer DA1 and each of the channel structures CH, and the second memory pattern ML2 may be disposed between the gate stacked structure GST and each of the channel structures CH.

Referring to FIGS. 2A, 2B, and 2C, each of the conductive patterns CP may include at least one of a silicon layer, a metal silicide layer, a metal layer, and a metal nitride layer. Each of the conductive patterns CP may include metal, such as tungsten (W), for low-resistance lines. According to this embodiment, a barrier layer (not shown) may be further formed to mitigate each of the conductive patterns CP from directly contacting the interlayer insulating layers ILD that are adjacent to each of the conductive patterns CP and mitigate each of the conductive patterns CP from directly contacting the memory layer ML. The barrier layer may include a metal nitride layer. For example, the barrier layer may include a titanium nitride layer, a tungsten nitride layer, and a tantalum nitride layer. However, embodiments of the present disclosure are not limited thereto, and the barrier layer may be omitted. Each of the conductive patterns CP may include various types of metal, such as molybdenum (Mo), other than tungsten (W).

The interlayer insulating layers ILD may respectively include various insulating materials. For example, each of the interlayer insulating layers ILD may include a silicon oxide layer.

Each of the memory layer ML, the first memory pattern ML1, and the second memory pattern ML2 may include a tunnel insulating layer that surrounds each of the channel structures CH, a data storage layer that surrounds the tunnel insulating layer, and a blocking insulating layer that surrounds the data storage layer.

The semiconductor memory device, illustrated in FIG. 2A, 2B, or 2C, may be formed using manufacturing processes illustrated in FIGS. 3A to 3F.

FIGS. 3A to 3F are cross-sectional diagrams illustrating a method of manufacturing a semiconductor memory device according to an embodiment.

Figure 3A:
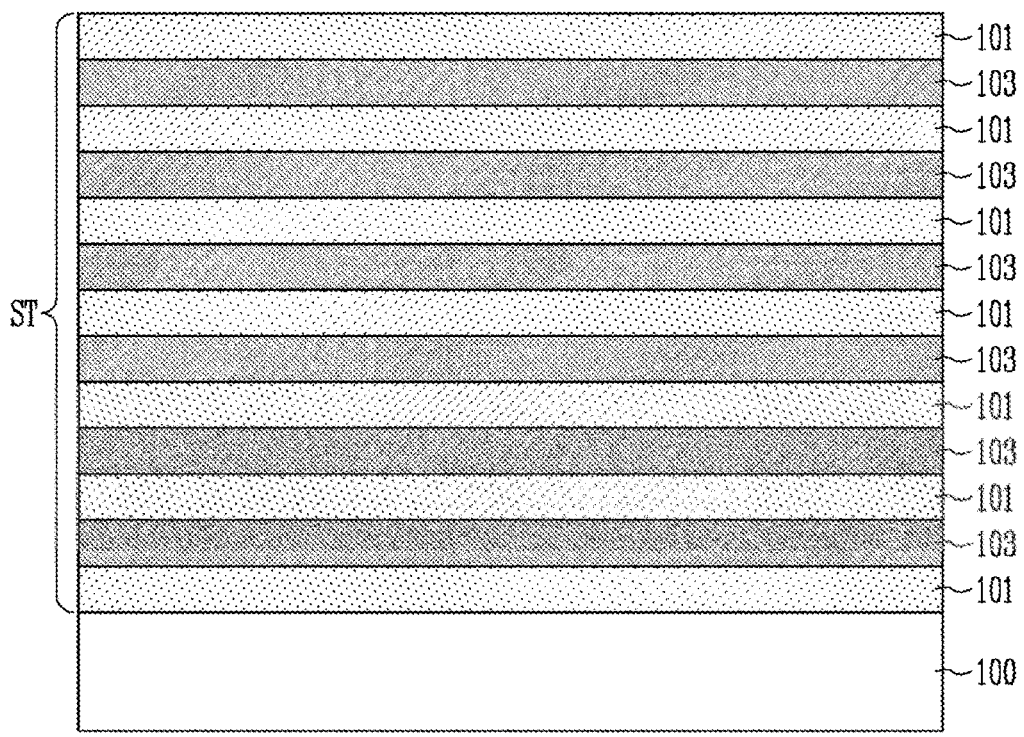
FIGS. 3A to 3F are cross-sectional diagrams illustrating a method of manufacturing a semiconductor memory device according to an embodiment.

As shown in FIG. 3A, a stacked structure ST may be formed over a lower structure 100. For example, the lower structure 100 may include the source doped semiconductor layer SDA, shown in FIG. 2A or 2B. However, embodiments are not limited thereto. For example, the lower structure 100 may include a sacrificial substrate or may include a preliminary structure for the first doped semiconductor layer DA1 and the second doped semiconductor layer DA2, shown in FIG. 2C. The stacked structure ST may include a plurality of interlayer insulating layers 101 and a plurality of sacrificial layers 103 that are alternately stacked on each other. The plurality of interlayer insulating layers 101 and the plurality of sacrificial layers 103 may be stacked such that each of the plurality of interlayer insulating layers 101 and each of the plurality of sacrificial layers 103 are repeatedly and alternately stacked on top of each other in the vertical direction.

A material that is included in the plurality of interlayer insulating layers 101 may have a different etch selectivity from a material that is included in the plurality of sacrificial layers 103 with respect to an etchant that is used in a subsequent wet etching process. The material that is included in the plurality of sacrificial layers 103 may be removed more quickly than the material that is included in the plurality of interlayer insulating layers 101 through the wet etching process. According to an embodiment, the plurality of interlayer insulating layers 101 may include a silicon oxide layer and the plurality of sacrificial layers 103 may include a silicon nitride layer.

Figure 3B:
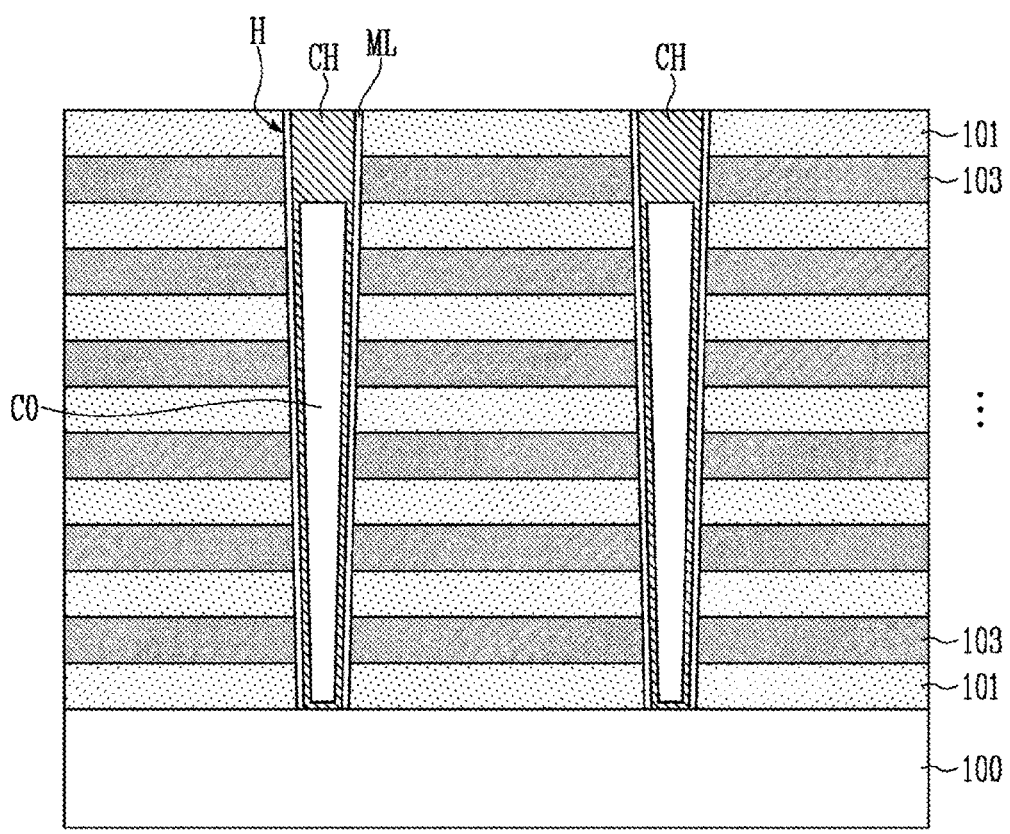

As shown in FIG. 3B, the channel structures CH may be formed over the lower structure 100. Forming the channel structures CH may include forming channel holes H and filling the channel holes H with the channel structures CH, respectively. Before forming the channel structures CH, forming the memory layer ML on a surface of each of the channel holes H may be further included. When the memory layer ML is formed on the surface of each of the channel holes H, each of the channel structures CH may be formed on the memory layer ML.

The channel holes H may be formed by etching the stacked structure ST. For example, the channel holes H may be formed by anisotropically etching the plurality of interlayer insulating layers 101 and the plurality of sacrificial layers 103. An etching mask layer (not shown) may be used to form the channel holes H. A surface of the lower structure 100 may be exposed through the channel holes H. The channel holes H may be formed to be perpendicular to the surface of the lower structure 100.

The memory layer ML may extend along the sidewall of each of the channel structures CH. The memory layer ML may include a tunnel insulating layer that surrounds each of the channel structures CH, a data storage layer that surrounds the tunnel insulating layer, and a blocking insulating layer that surrounds the data storage layer.

Figure 3C:
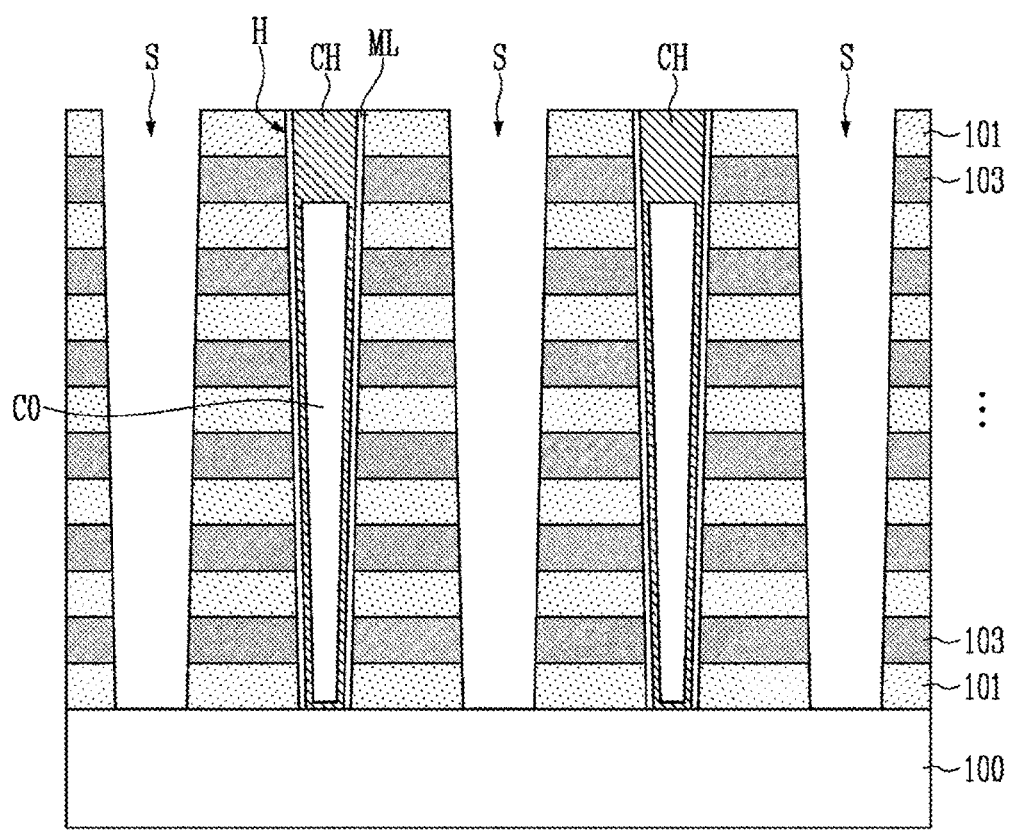

As shown in FIG. 3C, the slits S may be formed. Each of the slits S may be a vertical recess. The stacked structure ST may be etched to form the slits S. A part of the top surface of the lower structure 100, sidewalls of the plurality of interlayer insulating layers 101, and sidewalls of the plurality of sacrificial layers 103 may be exposed by each of the slits S. Each of the slits S may be located between the plurality of channel structures CH. Before forming the slits S, capping layers (not shown) may be formed. The capping layers may protect the channel structures CH when the slits S are formed. The capping layers may be a material having etch selectivity with respect to the plurality of interlayer insulating layers 101 and the plurality of sacrificial layers 103.

Figure 3D:
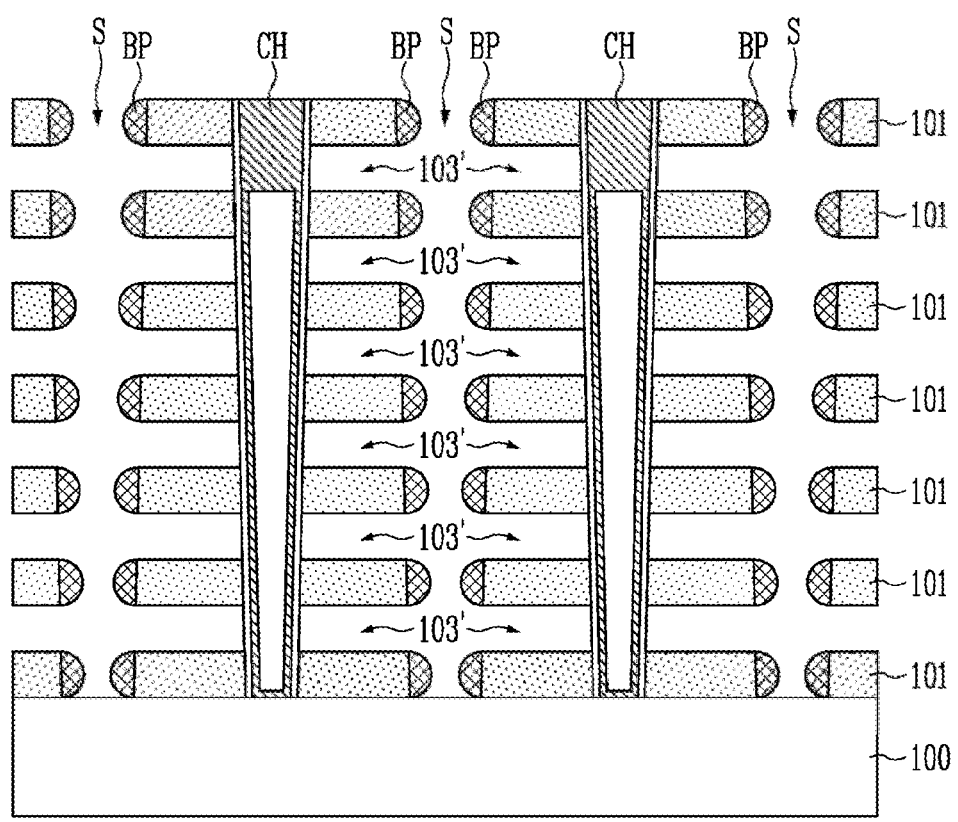

As shown in FIG. 3D, a plurality of horizontal recesses 103' may be formed. The plurality of sacrificial layers 103 that are exposed through the slits S may be removed to form the plurality of horizontal recesses 103'. Each of the plurality of horizontal recesses 103' may partially expose a sidewall of the memory layer ML. The plurality of sacrificial layers 103 may be selectively removed through a wet etching process. According to an embodiment, when the plurality of sacrificial layers 103 include a silicon nitride layer, the plurality of sacrificial layers 103 may be removed through a wet etching process using a phosphoric acid solution. Each of the plurality of horizontal recesses 103' may be formed between the plurality of interlayer insulating layers 101 by removing the plurality of sacrificial layers 103.

During a wet etching process that removes the plurality of sacrificial layers 103, a byproduct BP may be produced at the end of each of the plurality of interlayer insulating layers 101. According to an embodiment, the byproduct BP may include silicic acid. The silicic acid may be a compound including silicon, oxygen, and hydrogen. Examples of the silicic acid may include SiOH. The silicic acid may be formed through a reaction between a phosphoric acid solution and a silicon nitride layer. Alternatively, the silicic acid may be formed by partially protonating a silicon oxide, i.e., SiOx, included in the plurality of interlayer insulating layers 101.

Figure 3E:
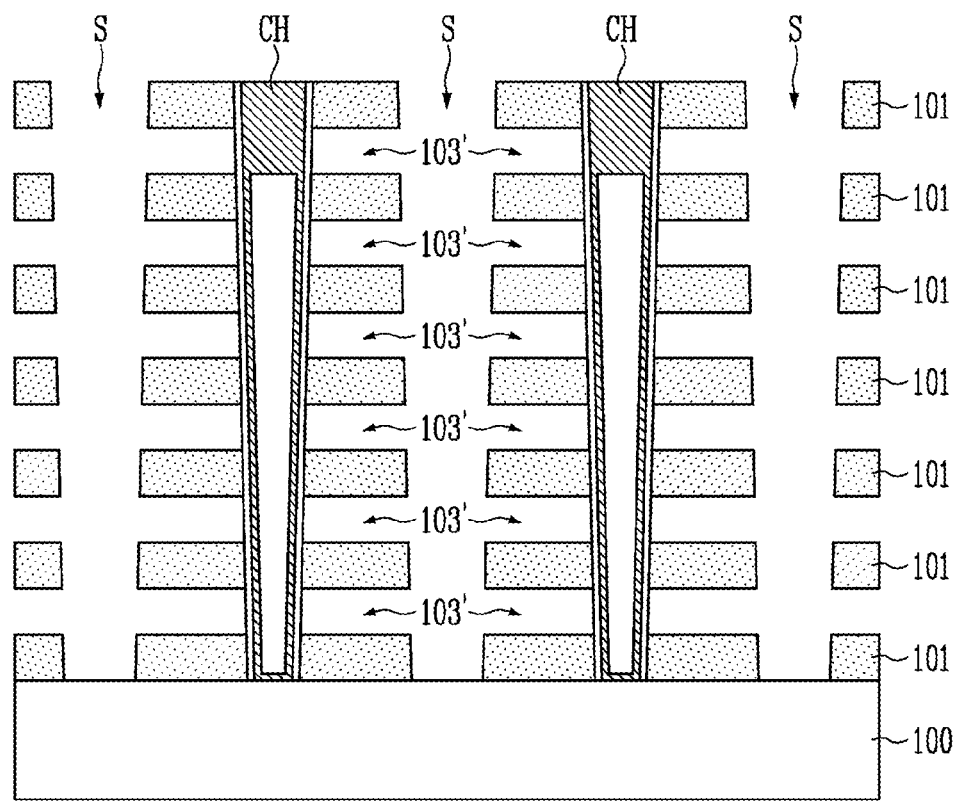

As shown in FIG. 3E, the byproduct BP that is produced at the end of each of the plurality of interlayer insulating layers 101 may be removed. The byproduct BP may be removed through a dry etching process. The byproduct BP may be selectively removed with respect to the plurality of interlayer insulating layers 101 through the dry etching process. According to an embodiment, the byproduct BP may include silicic acid, which may be selectively removed using an $HF_2^-$ ion. The $HF_2^-$ ion may be formed from nitrogen trifluoride ($NF_3$) gas, water vapor ($H_2O$), and oxygen ($O_2$) gas. According to an embodiment, the $HF_2^-$ ion may be formed by controlling the pressure to be 7 Torr to 10 Torr and a Radio Frequency (RF) power to be 100 W to 350 W in a reaction chamber that is used for a dry etching process, and by injecting, into the reaction chamber, nitrogen trifluoride ($NF_3$) gas that has a flow rate that is controlled to be 10 sccm to 25 sccm, water vapor ($H_2O$) that has a flow rate that is controlled to be 1000 mgm to 3000 mgm, and oxygen ($O_2$) gas that has a flow rate that is controlled to be 100 sccm to 200 sccm.

Through the dry etching process according to an embodiment, the etch selectivity of the byproduct BP with respect to the interlayer insulating layer 101 may be increased to be greater than that in a cleaning process that uses a Buffered Oxide Etchant (BOE). For example, the etch selectivity of the byproduct BP with respect to the interlayer insulating layer 101 may be 0.5 that is less than 1 in the cleaning process that uses the BOE. The etch selectivity of the byproduct BP with respect to the interlayer insulating layer 101 may be controlled to be greater than or equal to 1 in the dry etching process according to an embodiment. According to an embodiment, the etch selectivity of the byproduct BP with respect to the interlayer insulating layer 101 is 1.2 in a dry etching process that uses an $HF_2^-$ ion, which means that the byproduct BP may be removed 1.2 times faster than the interlayer insulating layer 101.

A fume including silicon tetrafluoride ($SiF_4$) may be produced through a reaction between silicic acid and the $HF_2^-$ ion. The fume may be removed through a cleaning process that uses deionized (DI) water.

Figure 3F:
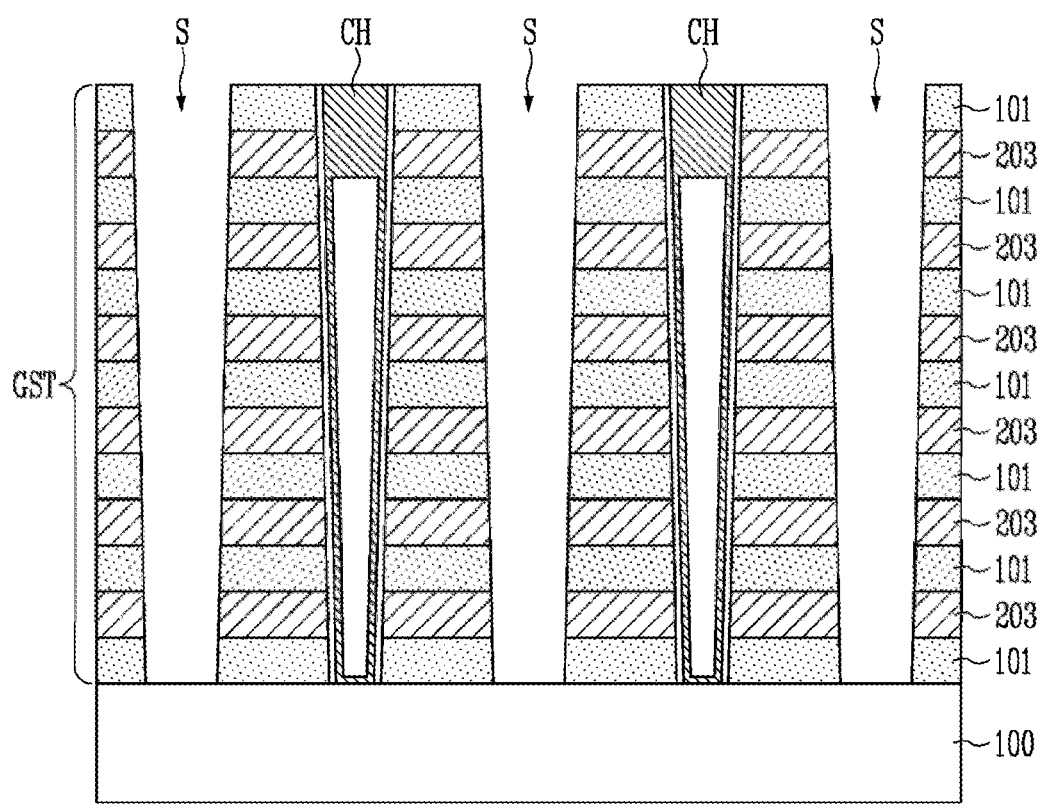

As shown in FIG. 3F, the plurality of horizontal recesses 103' may be filled with conductive patterns 203. The conductive patterns 203 may include at least one of metal, metal silicide, a metal nitride, and a doped silicon layer. The conductive patterns 203 may include a low-resistance metal, such as tungsten (W) for low-resistance lines. However, metal is not limited to tungsten (W), and for example, may include molybdenum (Mo).

Various processes may be further performed before or after the processes, shown in FIGS. 3A to 3F, are performed, thereby providing semiconductor memory devices having various structures. Hereinafter, various embodiments of a semiconductor memory device are described based on the structure shown in FIG. 2A.

Figure 4A:
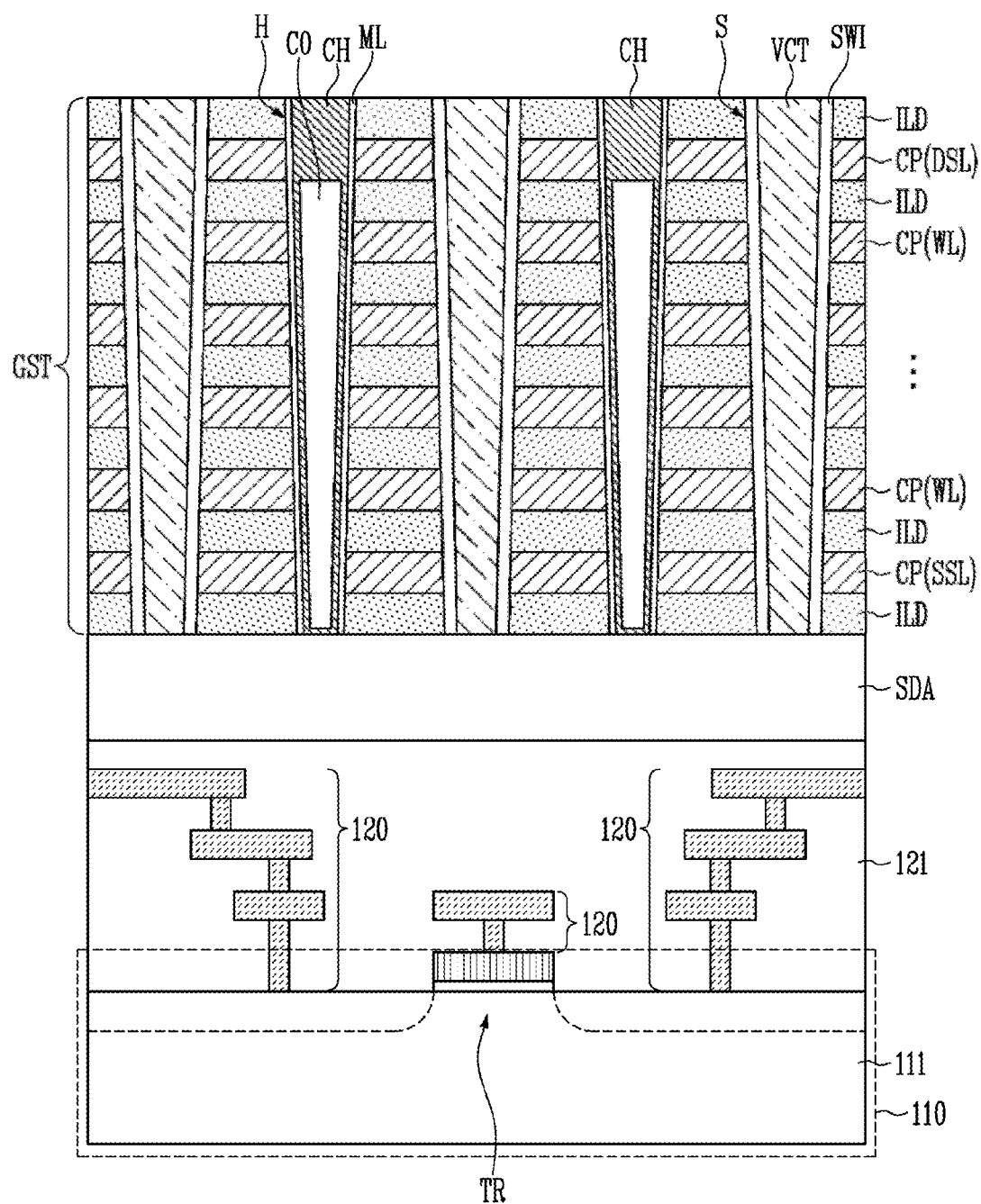
FIGS. 4A and 4B are cross-sectional diagrams illustrating embodiments of configurations of a semiconductor memory device shown in FIG. 2A.
Figure 4B:
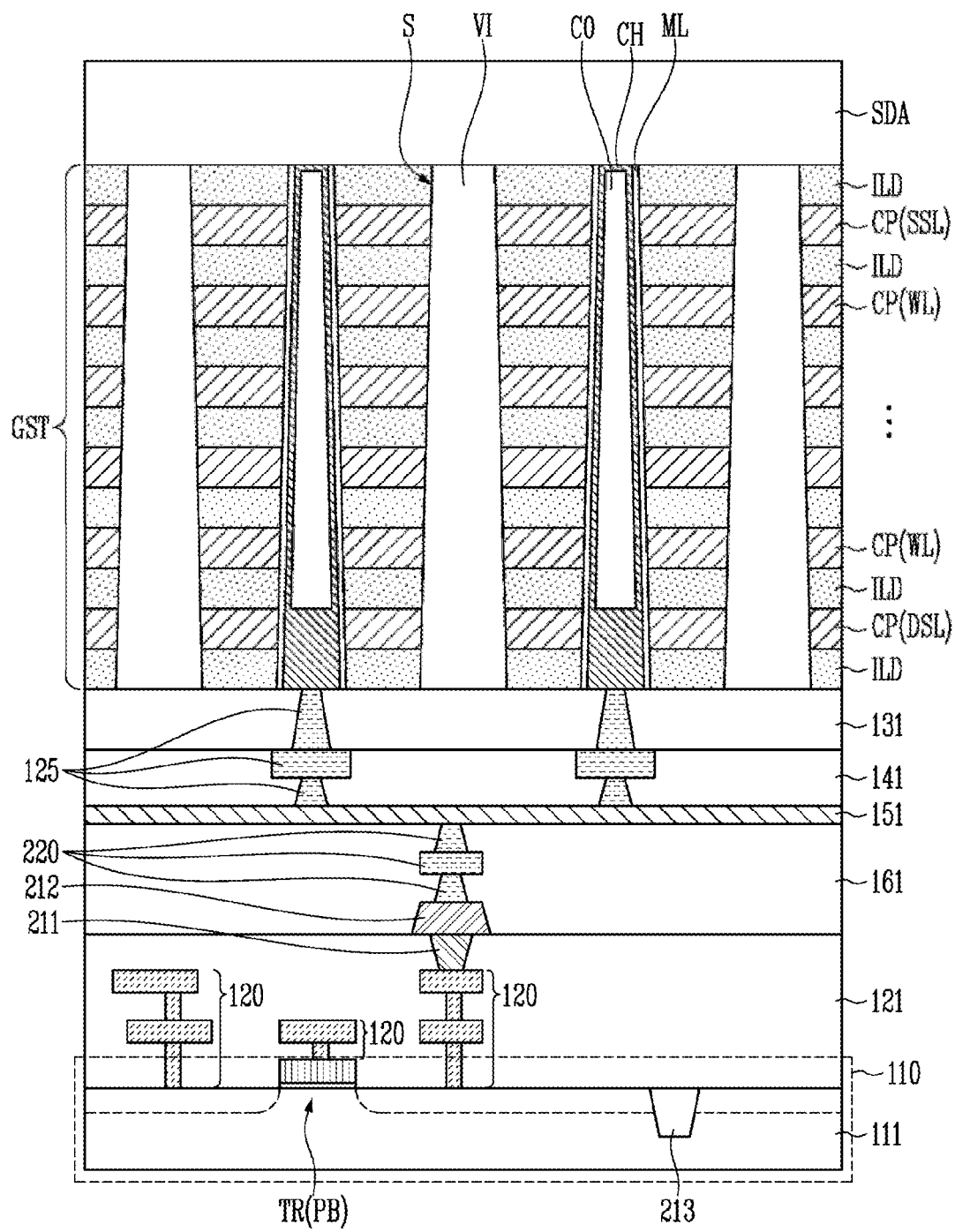

FIGS. 4A and 4B are cross-sectional diagrams illustrating embodiments of configurations of the semiconductor memory device, shown in FIG. 2A. Hereinafter, a detailed description of components, already described above with reference to FIG. 2A, will be omitted for the sake of brevity.

Referring to FIGS. 4A and 4B, the gate stacked structure GST and the source doped semiconductor layer SDA may overlap a peripheral circuit structure 110.

The peripheral circuit structure 110 may include a plurality of transistors TR that are disposed on a semiconductor substrate 111. The plurality of transistors TR may be configured to control at least one of a bit line 151, the source doped semiconductor layer SDA, and the plurality of conductive patterns CP. The plurality of transistors TR in various structures may be disposed on the semiconductor substrate 111. Each of the plurality of transistors TR may be disposed in an active region of the semiconductor substrate 111 that is defined by an isolation layer 213.

The plurality of transistors TR and the semiconductor substrate 111 may be covered by a lower insulating structure 121. The lower insulating structure 121 may include two or more insulating layers. Each of the plurality of transistors TR may be connected to a peripheral circuit-side interconnection 120. The peripheral circuit-side interconnection 120 may include a plurality of conductive patterns and may be embedded in the lower insulating structure 121.

Referring to FIG. 4A, the source doped semiconductor layer SDA may be disposed over the lower insulating structure 121 to overlap the lower insulating structure 121. The interlayer insulating layers ILD and the conductive patterns CP of the gate stacked structure GST may overlap the lower insulating structure 121 with the source doped semiconductor layer SDA, interposed therebetween. As described above with reference to FIG. 2A, the conductive patterns CP of the gate stacked structure GST may be classified into the source select line SSL, the word line WL, or the drain select line DSL. The distance between the peripheral circuit structure 110 and the source select line SSL may be smaller than the distance between the peripheral circuit structure 110 and the drain select line DSL. The source doped semiconductor layer SDA may be connected to a conductive vertical contact VCT in the slit S. The conductive vertical contact VCT may be insulated from the conductive patterns CP by a sidewall insulating layer SWI. The sidewall insulating layer SWI may be disposed on a sidewall of the slit S.

According to an embodiment, processes of forming the source doped semiconductor layer SDA, the gate stacked structure GST, the memory layer ML that is surrounded by the gate stacked structure GST, the channel structure CH that is surrounded by the memory layer ML and including the core insulating layer CO and the like, the sidewall insulating layer SWI, and the conductive vertical contact VCT may be performed over the lower insulating structure 121.

Referring to FIG. 4B, an upper portion of the lower insulating structure 121 may be penetrated by a first bonding metal 211. The first bonding metal 211 may be connected to the peripheral circuit-side interconnection 120. An upper insulating structure 161, a second bonding metal 212, a cell array-side interconnection 220, the bit line 151, a contact structure 125, the gate stacked structure GST, the memory layer ML, the core insulating layer CO, the channel structure CH, and the source doped semiconductor layer SDA may be disposed over the lower insulating structure 121 and the first bonding metal 211.

The gate stacked structure GST may be disposed between the source doped semiconductor layer SDA and the lower insulating structure 121. The bit line 151 and the upper insulating structure 161 may be disposed between the gate stacked structure GST and the lower insulating structure 121. The upper insulating structure 161 may be disposed between the lower insulating structure 121 and the bit line 151. The cell array-side interconnection 220 and the second bonding metal 212 may be embedded in the upper insulating structure 161. The second bonding metal 212 may be electrically coupled to the bit line 151. The transistor TR that is connected to the bit line 151 via the cell array-side interconnection 220, the second bonding metal 212, the first bonding metal 211, and the peripheral circuit-side interconnection 120 may form a page buffer PB of the peripheral circuit structure 110.

Insulating layers 131 and 141 may be disposed between the gate stacked structure GST and the bit line 151. The bit line 151 may be electrically coupled to the channel structure CH via the contact structure 125 that passes through the insulating layers 131 and 141. The conductive pattern CP that is adjacent to the bit line 151 may be configured as the drain select line DSL, and the conductive pattern CP that is adjacent to the source doped semiconductor layer SDA may be configured as the source select line SSL. A vertical insulating structure VI may be disposed in each of the slits S.

A cell array structure that includes the upper insulating structure 161, the second bonding metal 212, the cell array-side interconnection 220, the bit line 151, the contact structure 125, the gate stacked structure GST, the memory layer ML, the core insulating layer CO, the channel structure CH, and the vertical insulating structure VI, described above, may be formed over a sacrificial substrate (not shown). Subsequently, the second bonding metal 212 may be bonded to the first bonding metal 211 and the sacrificial substrate may be removed to expose the channel structure CH. The source doped semiconductor layer SDA may be formed after the sacrificial substrate is removed.

Figure 5:
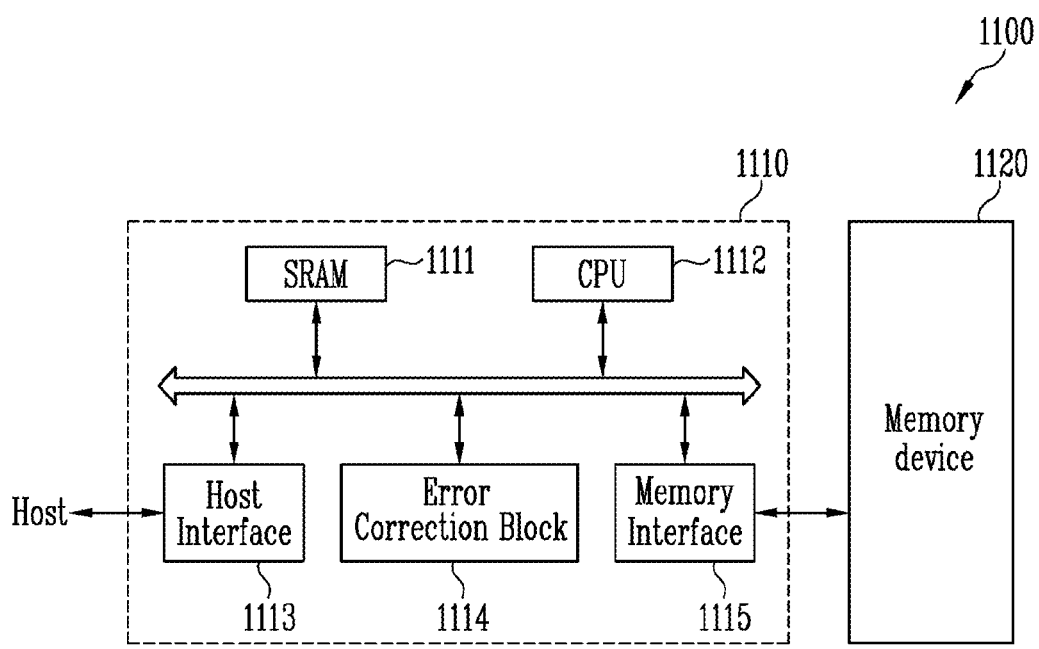
FIG. 5 is a block diagram illustrating a configuration of a memory system according to an embodiment.

FIG. 5 is a block diagram illustrating a configuration of a memory system 1100 according to an embodiment.

Referring to FIG. 5, the memory system 1100 may include a memory device 1120 and a memory controller 1110.

The memory device 1120 may be a multi-chip package including a plurality of flash memory chips. The memory device 1120 may be a nonvolatile memory device. In addition, the memory device 1120 may be manufactured by a manufacturing method described above with reference to FIGS. 3A to 3F. According to an embodiment, a defect in the memory device 1120 that is caused by a byproduct may be mitigated, thereby improving operational reliability of the memory device 1120.

The memory controller 1110 may be configured to control the memory device 1120 and may include Static Random Access Memory (SRAM) 1111, a Central Processing Unit (CPU) 1112, a host interface 1113, an error correction block 1114, and a memory interface 1115. The SRAM 1111 may serve as operational memory of the CPU 1112, the CPU 1112 may perform general control operations for data exchange of the memory controller 1110, and the host interface 1113 may include a data exchange protocol of a host accessing the memory system 1100. The error correction block 1114 may detect and correct an error included in data read from the memory device 1120. The memory interface 1115 may interface with the memory device 1120. The memory controller 1110 may further include Read Only Memory (ROM) for storing code data for interfacing with the host.

The memory system 1100 having the above-described configuration may be a Solid State Drive (SSD) or a memory card in which the memory device 1120 and the memory controller 1110 are combined. For example, when the memory system 1100 is an SSD, the memory controller 1110 may communicate with an external device (e.g., a host) through one of various interface protocols including a Universal Serial Bus (USB), a MultiMedia Card (MMC), Peripheral Component Interconnect Express (PCIe), Serial Advanced Technology Attachment (SATA), Parallel Advanced Technology Attachment (PATA), a Small Computer System Interface (SCSI), an Enhanced Small Disk Interface (ESDI), and Integrated Drive Electronics (IDE).

Figure 6:
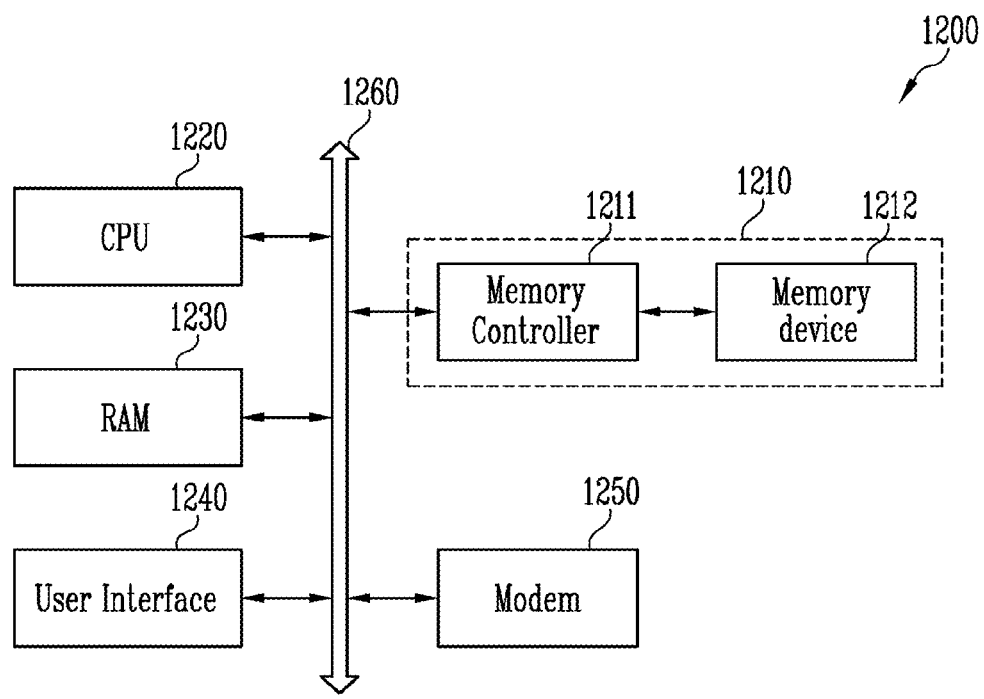
FIG. 6 is a block diagram illustrating a configuration of a computing system according to an embodiment.

FIG. 6 is a block diagram illustrating a configuration of a computing system 1200 according to an embodiment.

Referring to FIG. 6, the computing system 1200 may include a Central Processing Unit (CPU) 1220, Random Access Memory (RAM) 1230, a user interface 1240, a modem 1250, and a memory system 1210 that are electrically coupled to a system bus 1260. When the computing system 1200 is a mobile device, a battery for supplying an operating voltage to the computing system 1200 may be further included, and an application chipset, an image processor, mobile DRAM, and the like may be further included.

The memory system 1210 may include a memory device 1212 and a memory controller 1211. The memory device 1212 may be configured in the same manner as the memory device 1120 described above with reference to FIG. 5. The memory controller 1211 may be configured in the same manner as the memory controller 1110 described above with reference to FIG. 5.

According to embodiments of the present disclosure, a byproduct that is produced at an end of an interlayer insulating layer when a sacrificial layer is replaced by a conductive pattern may be selectively removed with respect to the interlayer insulating layer. Accordingly, according to embodiments of the present disclosure, a defect in a semiconductor memory device that is caused by the byproduct may be mitigated, and therefore operational reliability of the semiconductor memory device may be improved.

What is claimed is:

1. A method of manufacturing a semiconductor memory device, the method comprising:
   alternately stacking sacrificial layers and interlayer insulating layers over a lower structure;
   forming a slit passing through the sacrificial layers and the interlayer insulating layers;
   removing the sacrificial layers through the slit through a wet etching process; and
   removing, through a dry etching process, a byproduct that is produced at ends of the interlayer insulating layers during the wet etching process.

2. The method of claim 1, wherein phosphoric acid is used in the wet etching process.

3. The method of claim 1, wherein the byproduct includes silicic acid.

4. The method of claim 3, wherein the silicic acid includes SiOH.

5. The method of claim 3, wherein the dry etching process includes an operation of forming an $HF_2^-$ ion.

6. The method of claim 5, wherein the $HF_2^-$ ion is formed by injecting water vapor that has a flow rate of 1000 mgm to 3000 mgm, nitrogen trifluoride ($NF_3$) gas that has a flow rate of 10 sccm to 25 sccm, and oxygen ($O_2$) gas that has a flow rate of 100 sccm to 200 sccm into a reaction chamber to which a pressure of 7 Torr to 10 Torr and electric power of 100 W to 350 W are applied.

7. The method of claim 5, wherein silicon tetrafluoride ($SiF_4$) is produced through a reaction between the silicic acid and the $HF_2^-$ ion during the dry etching process.

8. The method of claim 7, further comprising removing the silicon tetrafluoride ($SiF_4$) by using deionized (DI) water.

9. The method of claim 1, wherein the byproduct with respect to the interlayer insulating layers is selectively removed through the dry etching process.

10. The method of claim 1, wherein the dry etching process makes an etch selectivity of the byproduct with respect to the interlayer insulating layers greater than or equal to 1.

11. The method of claim 10, wherein the etch selectivity is 1.2.

* * * * *